US012635267B2

(12) United States Patent
Lo et al.

(10) Patent No.: US 12,635,267 B2
(45) Date of Patent: May 19, 2026

(54) HIGH SPEED AND HIGH TIMING RESOLUTION CYCLING EXCITATION PROCESS (CEP) SENSOR ARRAY FOR NIR LIDAR

(71) Applicants: NANOVISION BIOSCIENCES, INC., San Diego, CA (US); THE REGENTS OF THE UNIVERSITY OF CALIFORNIA, Oakland, CA (US)

(72) Inventors: Yu-Hwa Lo, San Diego, CA (US); Yu-Hsin Liu, San Diego, CA (US); Hiren D. Thacker, San Diego, CA (US)

( * ) Notice: Subject to any disclaimer, the term of this patent is extended or adjusted under 35 U.S.C. 154(b) by 668 days.

(21) Appl. No.: 17/829,266

(22) Filed: May 31, 2022

(65) Prior Publication Data

US 2022/0384672 A1 Dec. 1, 2022

Related U.S. Application Data

(60) Provisional application No. 63/195,180, filed on May 31, 2021.

(51) Int. Cl.
| | |
|---|---|
| *H10F 30/225* | (2025.01) |
| *G01J 1/44* | (2006.01) |
| *G01S 17/88* | (2006.01) |

(52) U.S. Cl.
CPC ............ *H10F 30/2255* (2025.01); *G01J 1/44* (2013.01); *G01S 17/88* (2013.01); *G01J 2001/442* (2013.01)

(58) Field of Classification Search
CPC ............ H10F 30/2255; H10F 77/1248; H10F 77/244; G01J 1/44; G01J 2001/442; G01S 17/88; G01S 7/4816; Y02A 90/10
See application file for complete search history.

(56) References Cited

U.S. PATENT DOCUMENTS

| | | | | |
|---|---|---|---|---|
| 2004/0245592 A1* | 12/2004 | Harmon | ................ | H10F 30/225 257/E27.128 |
| 2013/0082286 A1* | 4/2013 | Finkelstein | ............. | H10F 77/45 257/E31.095 |
| 2019/0363213 A1* | 11/2019 | Lo | ......................... | H10F 77/166 |

* cited by examiner

*Primary Examiner* — Georgia Y Epps
*Assistant Examiner* — Monica T Taba
(74) *Attorney, Agent, or Firm* — NovoTechIP International PLLC

(57) ABSTRACT

High speed, and high timing resolution photon detecting systems and methods are presented with multiplication and self-quenching and self-recovering functions.

11 Claims, 7 Drawing Sheets

$$ENF = 1 + \frac{\sigma_M^2}{\langle M \rangle^2}$$

Photocurrent a b c d e Time

FIG. 5B

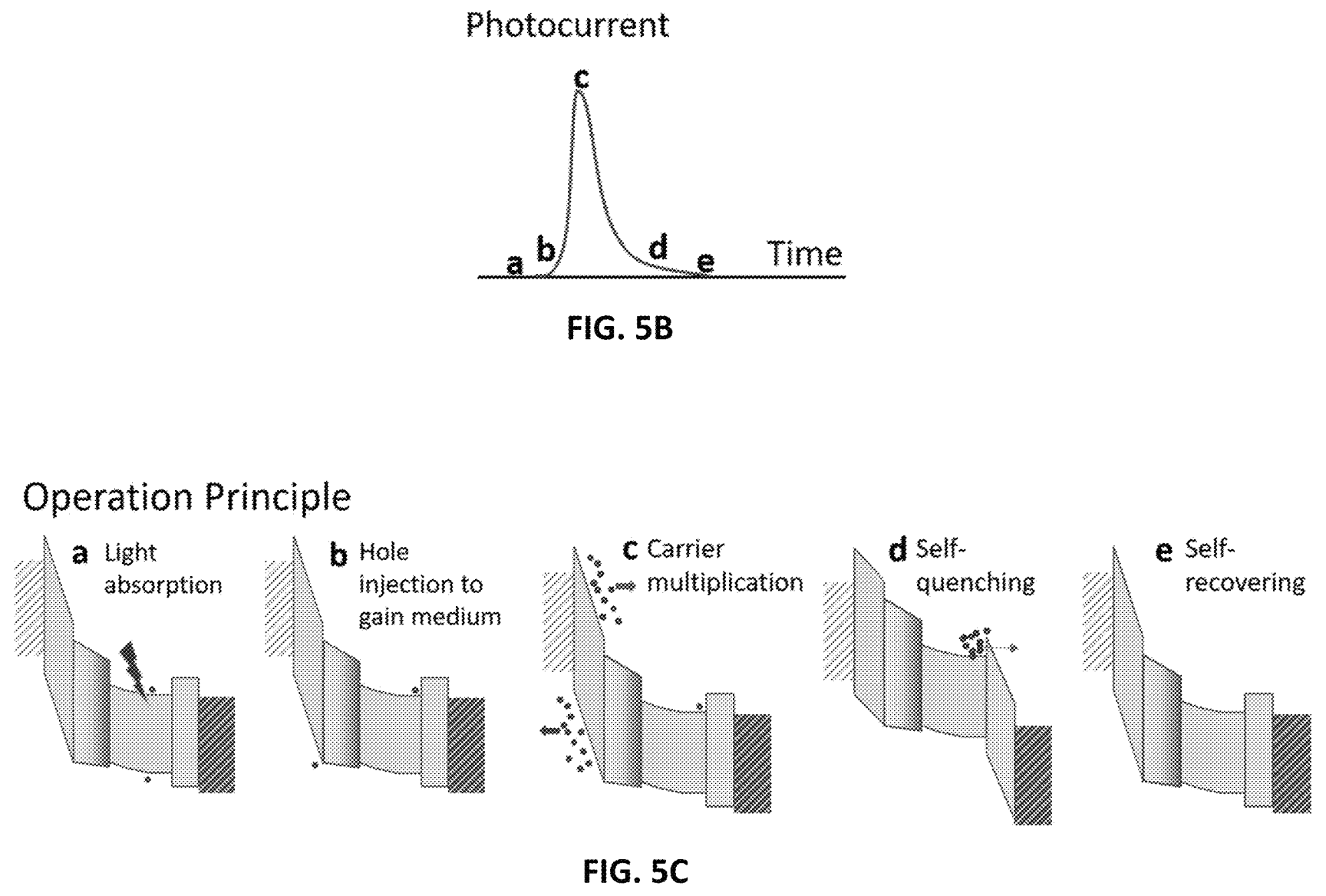

Operation Principle a Light absorption b Hole injection to gain medium c Carrier multiplication d Self-quenching e Self-recovering

FIG. 5C

Electron transport barrier

HIGH SPEED AND HIGH TIMING RESOLUTION CYCLING EXCITATION PROCESS (CEP) SENSOR ARRAY FOR NIR LIDAR

This Patent Application claims priority to U.S. Provisional Patent Application Ser. No. 63/195,180, filed May 31, 2021; the content of which is hereby incorporated by reference herein in its entirety into this disclosure.

BACKGROUND OF THE SUBJECT DISCLOSURE

Field of the Subject Disclosure

The present subject disclosure relates to systems and methods for detecting photons with high speed and high timing resolution.

Background of the Subject Disclosure

LiDAR (Light Detection And Ranging) is an active sensing technology used to create 3D depth-maps, or "point clouds" of the surrounding environment. A LiDAR system scans the region of interest using short eye-safe infrared laser pulses, captures photons reflected off objects in the field of view, and uses the time differences of emitted and received photons, combined with signal processing, to generate 3D depth-maps which include distance and sometimes velocity information for objects. LiDAR systems are finding rapid adoption as a crucial sensor technology for autonomous driving in passenger vehicles, robotic transports, and commercial fleets. To achieve Level 3 and above autonomy, LIDAR systems are required with long-range sensing, high spatial resolution, real-time performance, and eye-safe operation. The range is typically limited by sensitivity of the sensor and the maximum laser power allowed to remain eye-safe.

LIDAR is also an important system for remote sensing from space. For example, the NASA-CNES Cloud-Aerosol Lidar with Orthogonal Polarization (CALIOP) on the Cloud-Aerosol Lidar and Infrared Pathfinder Satellite Observation (CALIPSO) satellite has been operated successfully for 14 years to advance studies of cloud, aerosol and ocean science [1]. On the spaceborne CALIOP system, the laser emits a train of short (~10 ns) optical pulses towards nadir and the telescope collects the backscatter as the pulse propagates downward through the atmosphere and into the ocean, scattering from molecules, aerosols and cloud droplets along the way. By transmitting and receiving on 532 nm and 1064 nm wavelengths, and also resolving depolarization of the backscatter, the intrinsic properties of the scatterer can be inferred. The above two applications, autonomous driving and space remote sensing, both demand high sensitivity and high resolution short wavelength Lidar systems. One key component would be the detector array in the system.

Bulk Si SPADs (single-photon avalanche diodes) with high PDE (photon detection efficiency) use a thick Si layer to absorb NIR light, but the long absorption length results in long diffusion length and lowers the operation speed of the devices [2,3]. An improved design in bulk Si allows the electric field to reach-through the whole absorption region to sweep out the carriers and therefore increase speed [4]. Si APDs (avalanche diodes) have low excess noise, have been demonstrated to operate at room temperature, and integrate well with silicon readout circuits. However, Si is not sensitive to IR wavelengths. Emerging technologies aim to improve the performance of the Si APD at NIR wavelengths by integrating Ge via heteroepitaxial growth or wafer bonding. Unfortunately, both approaches introduce threading dislocations resulting in high dark count rates [5].

SPADs made from III-V materials, commonly using an InGaAs absorption layer and InP multiplication region, extend the wavelength sensitivity of solid-state detectors into the infrared regime. Due to the relatively larger defect density in III-V materials compared to Si, detectors are generally operated at lower temperature, 200-260K, to reduce the dark count rate [6]. However, cooling increases the average escape time for trapped carriers and subsequently increases the rate of afterpulsing. InGaAs APD utilizing impact ionization has been widely used in SWIR Lidar systems.

APDs can be operated in linear mode or Geiger mode based on the bias voltage. Geiger mode (GM) APDs operated above breakdown with significant (in the order of 100,000) gain to enable single photon sensitivity, a much sought after feature for LiDAR applications. However, GmAPDs cannot distinguish the multiphoton pulse returns without dividing each pixel into multiple sub-units, which reduces resolution. In addition, GmAPDs must be reset after each detection event. The time interval between quenching and reset is considered as dead time or recovering time during which the GmAPD pixel cannot detect the incoming photons. The dead time for practical InGaAs GmAPDs can be microseconds long, limiting the practical utility for commercial lidar applications (such as 3D-imaging) since it prevents a single-laser-shot reception of multiple target returns from closely spaced objects. It is also for this reason that the performance of GmAPD Lidar degrades considerably when the target is partially obscured. In addition, the active quenching and resetting circuit for each GmAPD pixel is rather complicated and takes large chip area, and can add costs and significantly complicate the hybrid integration of InGaAs GmAPD array with Si ROIC (readout integrated circuit).

SUMMARY OF THE SUBJECT DISCLOSURE

Photon detecting systems and methods are presented with multiplication, self-quenching, and self-recovering functions, which overcome many of the drawbacks and limitations of conventional systems, as discussed above.

In one exemplary embodiment, the present subject disclosure is a photodetector, which includes a light absorbing layer of InGaAsP; a heterostructure comprised of a layer of InP, a first layer and a second layer of InGaAsP sandwiching the layer of InP, wherein the heterostructure is positioned underneath the light absorbing layer of InGaAsP; an N—InP substrate positioned underneath the heterostructure; and a layer of a-Si positioned above the light absorbing layer of InGaAsP.

In another exemplary embodiment, the present subject disclosure is a photodetector, which includes a multiplication structure; a light absorbing layer positioned underneath the multiplication structure; a self-quenching and self-recovering structure positioned underneath the light absorbing layer; and a substrate positioned underneath the self-quenching and self-recovering structure.

In yet another exemplary embodiment, the present subject disclosure is a photodetector, which includes a light absorbing layer of InGaAsP with an $E_g$=1.1 um; a heterostructure comprised of an undoped layer of InP with a thickness of about 50 nm, and a first layer and a second layer of InGaAsP each with an $E_g$=1.0 um sandwiching the layer of InP, wherein the heterostructure is positioned underneath the light absorbing layer of InGaAsP; an N—InP substrate positioned underneath the heterostructure; and a layer of a-Si with thickness of about 30-50 nm positioned above the light absorbing layer of InGaAsP.

BRIEF DESCRIPTION OF THE DRAWINGS

FIG. 5B shows a self-quenching operation principle, and photocurrent over time, according to an exemplary embodiment of the subject disclosure.

FIG. 5C shows a self-quenching operation principle, and operation principle, according to an exemplary embodiment of the subject disclosure.

DETAILED DESCRIPTION OF THE SUBJECT DISCLOSURE

Figure 1A:
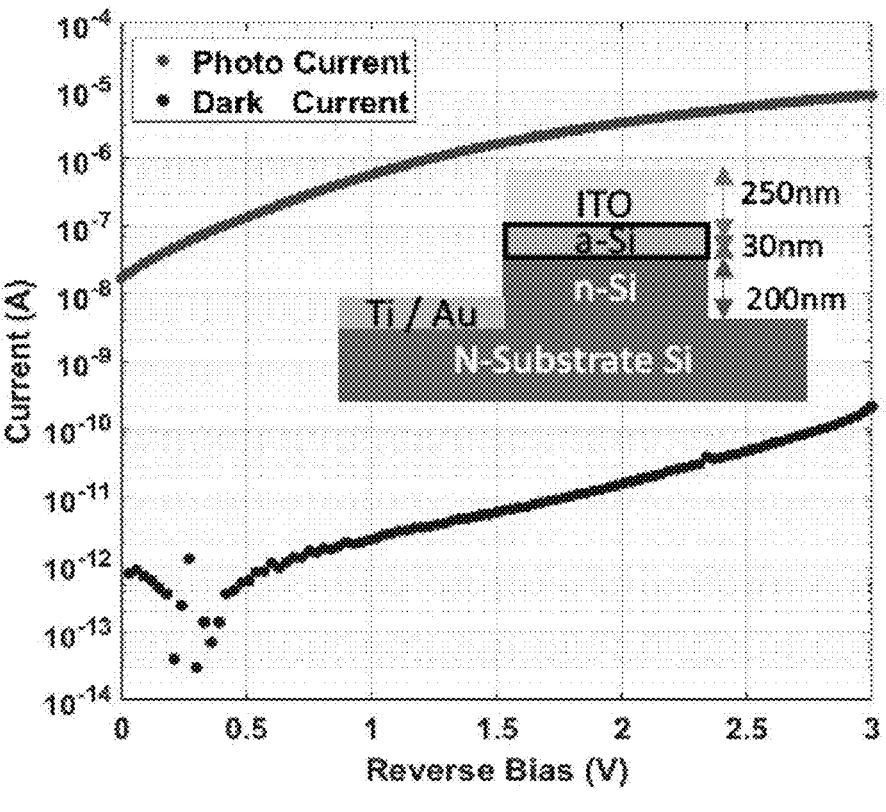
FIG. 1A shows characteristics of CEP detectors, with a-Si as the gain medium, comparing bias dependent photocurrent and dark current, according to an exemplary embodiment of the subject disclosure.

To address the conventional limits of InGaAs GmAPDs, as described above, the present subject disclosure proposes a high sensitivity SWIR single photon detector with a novel carrier multiplication mechanism that is far more efficient and "quiet" than impact ionization, also self-quenching and self-recovering functions to greatly simplify/eliminate the quenching circuits in the ROIC. The novel gain mechanism being referred to is the cycling excitation process (CEP) gain and the self-quenching and self-recovering function based on a bandgap engineered structure to control the dynamics of carrier transport.

Innovative Carrier Multiplication Mechanism: Cycling Excitation Process (CEP)

In 2015, the present inventors published the discovery of CEP in disordered materials by showing that this new carrier multiplication process is an order of magnitude more efficient than impact ionization used by conventional APDs and SPADs [7, 8].

The CEP mechanism, featured by American Institute of Physics (AIP) in its annual press release (January 2015) and Nature in its Research Highlight (September 2015), obtains its high carrier multiplication efficiency by involving "localized states" in the many-body interactions that generate new electron-hole (e-h) pairs. Instead of creating e-h pairs in the conduction/valence bands where each carrier possesses a well-defined k-vector as a Bloch wave, the CEP process generates bound excitons from localized states. The localization of carriers relaxes the k-selection rule, thus greatly increasing the probability of carrier multiplication. This is manifested by the characteristics of (a) much lower operation voltage to achieve high gain, (b) much thinner gain medium (i.e., 30-50 nm versus 300 nm to 1 $\mu$m in conventional SPADs), and (c) reduced timing jitter associated with the greatly reduced gain medium thickness.

The CEP mechanism has its second feature as a "phonon mediated carrier multiplication process." Although there is a very high probability for generating bound excitons as above described, these bound excitons cannot contribute to photocurrent without ionization into the mobile (conduction and valence) bands via phonon excitation. Therefore, the strength of electron-phonon interaction determines the amplification factor. When the number of bound excitons suddenly rises above its average level, the rate of electron (hole)-phonon interactions cannot keep up with the increasing rate of bound excitons, thus suppressing the gain fluctuation. This phonon-mediated process is manifested by the characteristics of (a) greatly suppressed excess noise factor and (b) capability of sub-Geiger mode (i.e., biased slightly below DC breakdown voltage) operation for high dynamic range and low afterpulsing effect. In the interest of brevity, other desirable properties such as ultrahigh gain-bandwidth product, etc., are not discussed here [9] for the CEP mechanism but indicate only those characteristics directly related to single photon detection.

The next determination is what materials will produce such CEP effect and how one can incorporate the materials into the device structure to produce high performance 1064 nm single photon detectors. Our studies based on quantum mechanical many-body calculations [10,11] suggest that CEP is a general effect that can occur in many disordered materials such as, for example, a-Si (amorphous silicon). Using H-passivated a-Si as an example, the material contains a high density of localized states in the tail of the mobile bands, providing the required states for bound excitons that can be excited by energetic electrons (holes). In addition, material disordering also produces localized phonons and studies have shown particularly strong interactions between localized electrons (holes) and localized phonons to facilitate the phonon-mediated amplification process.

Finally, a-Si can be easily deposited on many materials such as InP and InGaAsP, making the device fabrication process simple, inexpensive, and scalable.

Figure 1B:
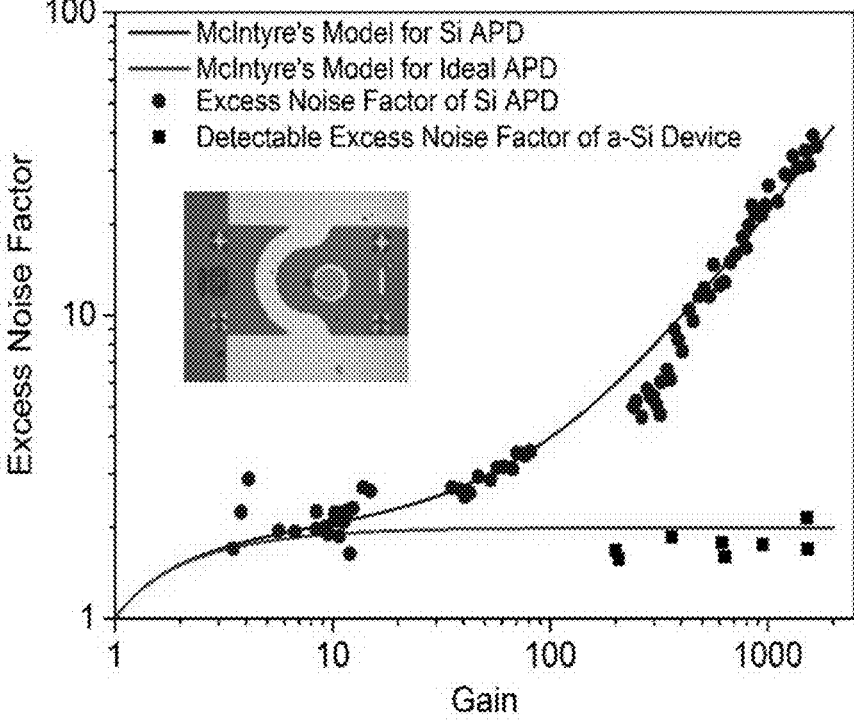
FIG. 1B shows characteristics of CEP detectors, with comparison of excess noise factor between a conventional Si APD and a a-Si CEO device, according to an exemplary embodiment of the subject disclosure.

The inventors have demonstrated CEP detectors with an a-Si CEP gain medium deposited on Si substrate. FIGS. 1A-1B show characteristics of CRP detectors with a-Si as the gain medium, with voltage dependent gain and excess noise measurements. FIG. 1A shows bias dependent photocurrent and dark current. A photocurrent gain of the order of 1000 was achieved with carrier multiplication in a 30 nm a-Si layer. In other words, at only 3V bias across a 30 nm a-Si layer, a multiplication factor of nearly 1000 was obtained, indicating that CEP effect is much more efficient than impact ionization in terms of carrier multiplication. FIG. 1B shows a comparison of excess noise factor between conventional Si APD (blue dots at top) and a 10 um diameter a-Si CEP device (black squares at bottom) measured at 70 MHz. As shown in FIG. 1B, the excess noise (measured at 70 MHz) of the CEP detector is much lower than a commercial Si APD, attributed to the suppression of gain fluctuation by the phonon-mediated process [8].

Figures 2A, 2B, 2C:
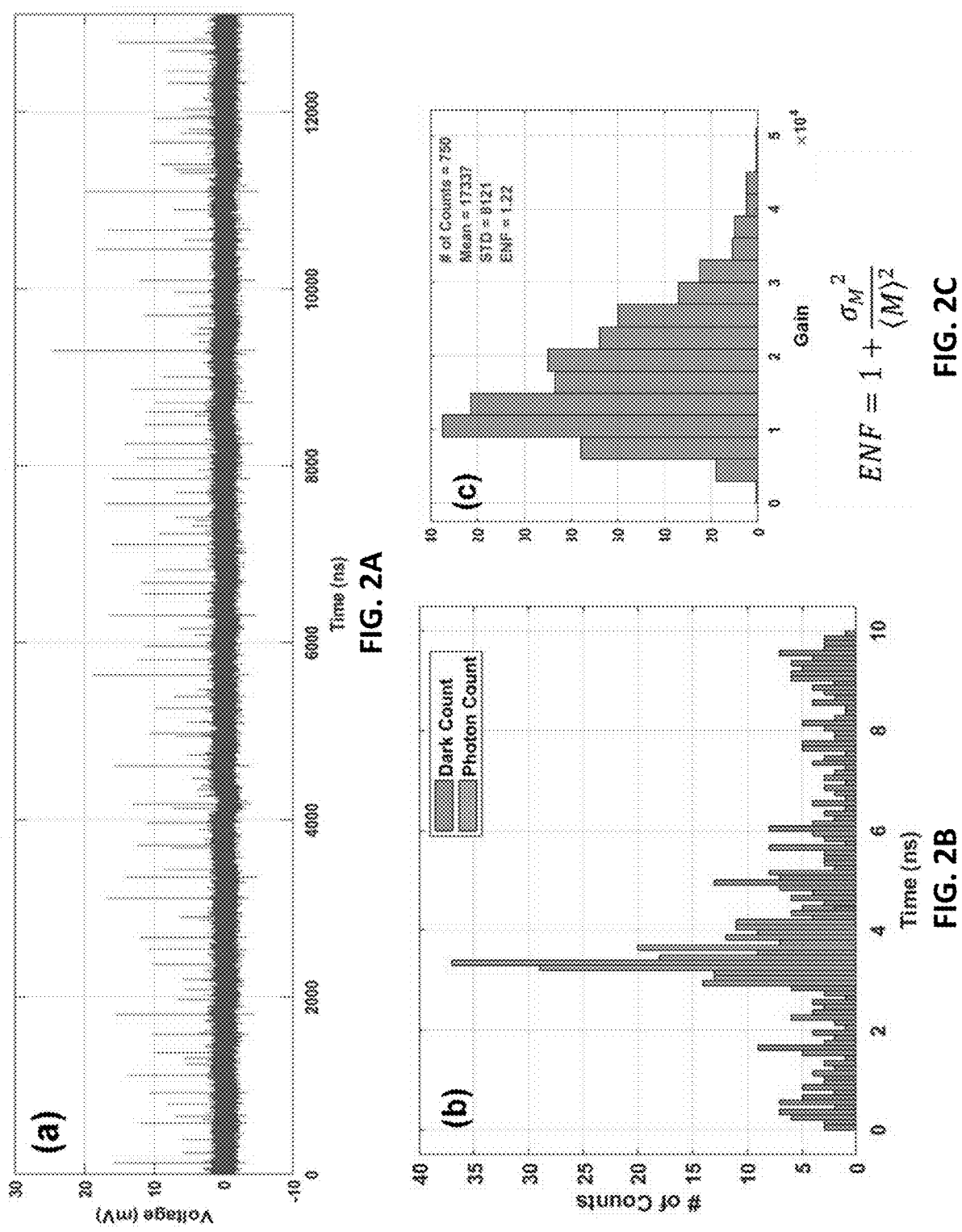
FIG. 2A shows a single photon response of a self-quenched and self-recovered CEP single-photon detector under room temperature, continuous operation, with detector response to a strain of single photon pulses, according to an exemplary embodiment of the subject disclosure.
FIG. 2B shows a single photon response of a self-quenched and self-recovered CEP single-photon detector under room temperature, continuous operation, with time correlated with measurements of single photon response, according to an exemplary embodiment of the subject disclosure.
FIG. 2C shows a single photon response of a self-quenched and self-recovered CEP single-photon detector under room temperature, continuous operation, with Geiger-mode gain distribution for the self-quenched CEP detector, according to an exemplary embodiment of the subject disclosure.

FIGS. 2A-2C shows a single photon response of a self-quenched and self-recovered CEP single-photon detector under room temperature, continuous operation. FIG. 2A shows a detector response to a train of single photon pulses at 0.7 photons/pulse. FIG. 2B shows time correlated measurements of single photon response. The orange part (middle including higher peak) is correlated to laser pulses with 1 ns pulse width. FIG. 2C shows Geiger-mode gain distribution for the self-quenched CEP detector. The statistics shows an average Geiger mode gain of 17,337 and an effective excess noise factor of 1.22 [10].

In more detail, FIGS. 2A-2C show the single photon response and Geiger-gain characteristics. Here, 5% C was added into a-Si to tailor the energy of localized phonons and the electron-phonon interaction. Given that carbon is lighter than silicon and C—Si bond is stronger than Si—Si bond, carbon doping creates high energy (90 meV) localized phonons to enhance electron-phonon interactions, which is in favor of noise suppression. As a result, the gain fluctuation under Geiger mode operation is further reduced. At 10 MHz optical pulses, the histogram of gain distribution in response to single photons shows that for an average Geiger-mode gain of 17,337, the excess noise factor is as low as 1.22 [12].

Notably this low excess noise in Geiger mode operation was obtained in room temperature "continuous mode operation" without any external quenching circuit. In other words, the device is self-quenched and self-recovered partly by the intrinsic mechanism of electron-phonon interaction and partly by a built-in self-quenching structure using band offset of different materials [13-15].

Other unique properties of the CEP detectors include, but are not limited to, a record high gain-bandwidth product of 2 THz (6× greater than the best APDs) [9]. G-B product is relevant to linear and sub-Geiger mode operations [16,17] but the focus here is a self-quenched Geiger-mode single photon detector at 1064 nm wavelength.

Innovative Self-Quenching and Self-Recovering Design

The subject disclosure applies the principle of bandgap engineering to design a self-quenching and self-recovering structure for novel devices. Compared to gated mode, continuous mode operation is much preferred for LiDAR systems. All SPADs today in continuous mode operation require quenching circuits. Because passive quenching has a long recovery time due to the large quenching resistor (typically 200K to 400K Ohm), active quenching is preferred. However, ROICs with active quenching circuits are complicated and take large real estate, thus limiting the number of pixels for LiDAR systems.

1.06 um Detectors

Figure 3A:
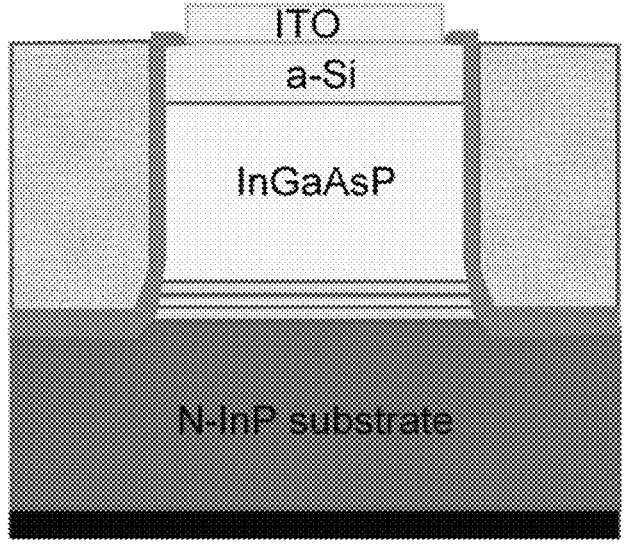
FIG. 3A shows a 1.06 um Photodetector with CEP amplification layer, and InGaAsP light absorption layer, according to an exemplary embodiment of the subject disclosure.
Figure 3B:
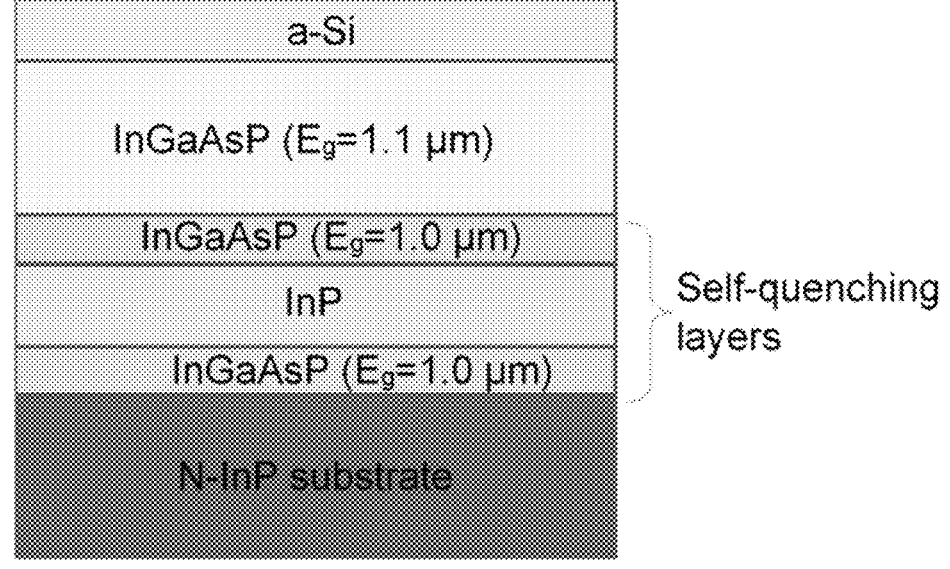
FIG. 3B shows an InGaAsP/InP/InGaAsP structure for self-quenching, according to an exemplary embodiment of the subject disclosure.

FIGS. 3A-3B show a 1.06 um photodetector with CEP amplification layer, InGaAsP light absorption layer, and InGaAsP/InP/InGaAsP structure for self-quenching, along with an ITO (indium tin oxide) layer. An InGaAsP ($E_g$=1.1 μm) light absorber is used that is lattice matched to InP to produce high quantum efficiency (>80%) at 1064 nm wavelength because of its high absorption coefficient and low primary dark current and dark count compared to InGaAs and Ge absorption layers. One of the novel features of the present design is using a thin (30-50 nm) layer of a-Si as the gain medium to replace conventional InP or InAlAs p-i-n junction. Further, an InGaAsP/InP/InGaAsP bandgap engineered multilayer structure is used to deliver the self-quenching and self-recovering functions, eliminating active quenching circuits in the readout integrated circuit (ROIC), and enabling the device to operate in continuous mode.

As shown in FIG. 3B, an undoped InP (50 nm thick) layer is sandwiched by 2 InGaAsP layers ($E_g$=1.0 μm) to form an InGaAsP/InP/InGaAsP structure for self-quenching. The InGaAsP/InP heterostructure forms a conduction band offset of 45 meV and a valence band offset of 75 meV at the interface. This multi-layer self-quenching layer may be positioned under the InGaAsP ($E_g$=1.1 μm) light absorption layer.

Without light illumination, the applied voltage mostly drops in a-Si due to the large resistivity of the material. When a 1064 nm photon is absorbed by the InGaAsP light absorption layer, the photoexcited hole travels towards the a-Si gain medium and gains kinetic energy to generate secondary electrons and holes via the CEP effect. Those extra electrons travel towards the bottom n-contact. However, before reaching the bottom n-contact, these electrons experience an energy barrier of 45 meV and are accumulated at the InGaAsP/InP interface. These accumulated electrons develop a voltage drop in the undoped InP layer, thus reducing the voltage across the a-Si CEP layer. Since the gain from the CEP effect depends strongly on the voltage, a reduced voltage drop in the CEP layer results in a sharp decrease in the rate of carrier multiplication and causes a sudden current drop (i.e., self-quenching). When the device is quenched, no extra electrons are generated by the CEP effect and the accumulated electrons at the InGaAsP/InP interface find their way to cross the 45 meV energy barrier via thermionic emission or field-enhanced tunneling. When the accumulated electrons escape the energy barrier, the device returns to the original state and the voltage across the a-Si CEP layer is restored. In other words, the detector is self-recovered and ready for detection of the next photon.

Figure 4A:
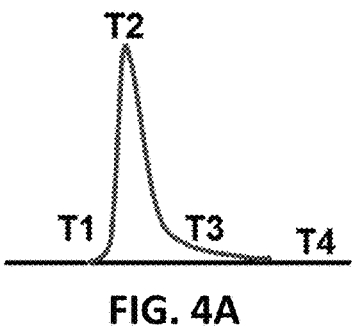
FIG. 4A shows a self-quenching and self-recovering process for a CEP detector, and photocurrent over time, according to an exemplary embodiment of the subject disclosure.
Figure 4B:
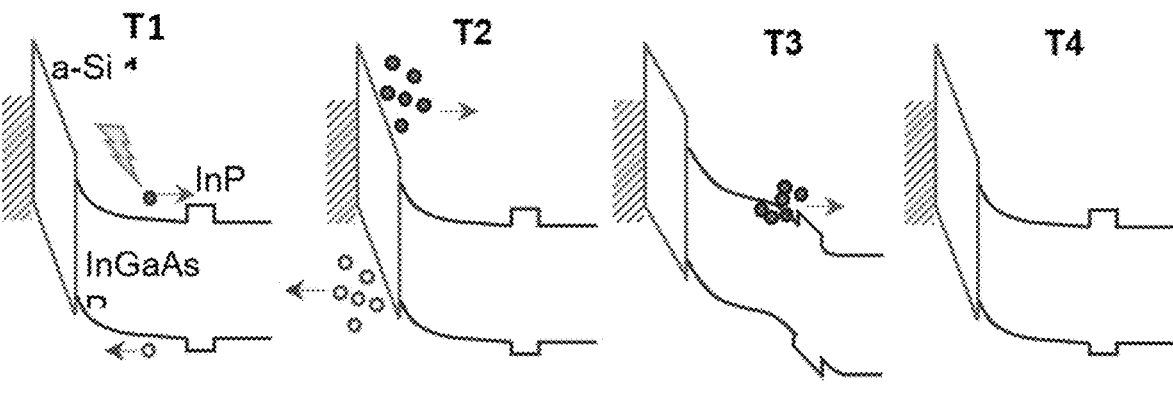
FIG. 4B shows a self-quenching and self-recovering process for a CEP detector, and individual steps in time, according to an exemplary embodiment of the subject disclosure.

FIGS. 4A-4B shows an illustration of the self-quenching and self-recovering process for a CEP detector. FIG. 4A shows photocurrent over time. FIG. 4B shows the detail at each step. At T1, a photoexcited e-h pair is formed. The photoexcited hole enters the a-Si gain medium. At T2, the CEP effect produces many new e-h pairs, causing rapid rise in the current. At T3, the travel of electrons is temporarily stopped by an energy barrier due to conduction band offset between InGaAsP and InP. These accumulated electrons cause a shift of the voltage drop from the a-Si layer to the barrier, quenching the photocurrent. At T4, those accumulated electrons escape the barrier via thermionic emission and tunneling, and the voltage distribution returns to the original state and the device is ready for detection of the next incoming photon.

1.55 um Detectors

Figure 5A:
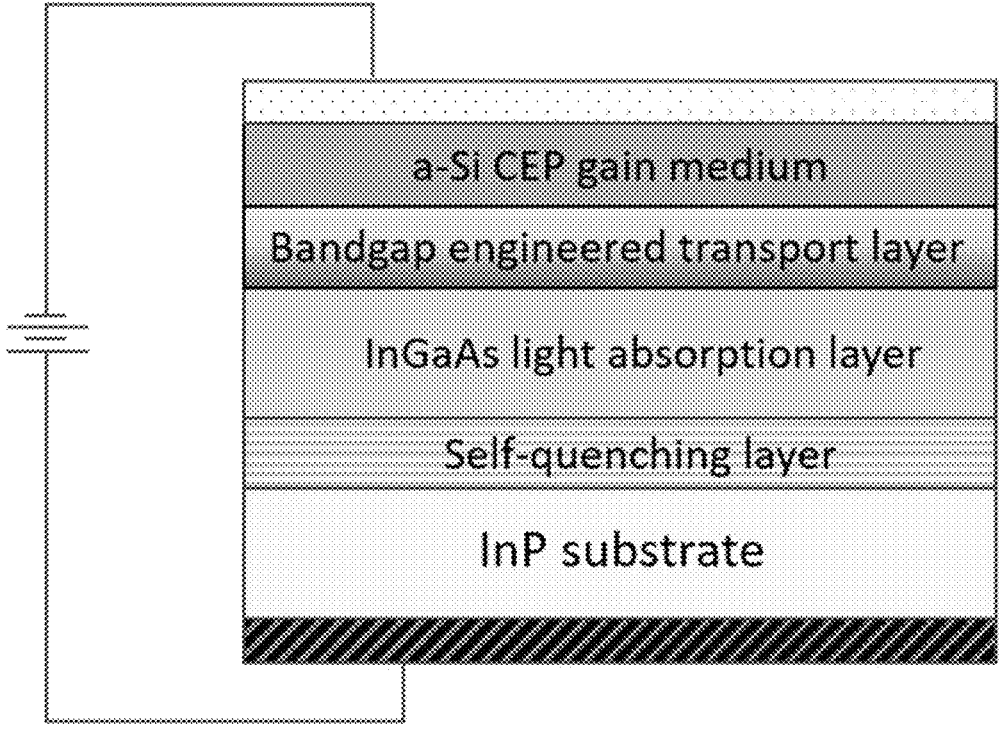
FIG. 5A shows a self-quenching operation principle, and photodetector design structure, according to an exemplary embodiment of the subject disclosure.

FIGS. 5A-5C show a self-quenching operation principle: (a) Incoming light is absorbed in the InGaAs layer and generates first electron-hole(e-h) pair. (b) The photoexcited hole enters a-Si gain medium. (c) The CEP effect generates more e-h pairs, causing rapid rise of the current. (d) The travel of the electrons is temporarily stopped by an energy barrier due to the conduction band offset. These accumulated electrons cause a shift of voltage drop from a-Si to the barrier, quenching the current. (e) Those accumulated electrons escape by thermionic emission and tunneling, the voltage distribution returns to the original states.

In more detail, as shown in FIG. 5A, InGaAs material is used as light absorption layer here for 1550 nm photodetector design. Due to the large resistivity of the material, a significant portion of applied voltage drops in a-Si gain medium. When a 1550 nm photon is absorbed by the InGaAs layer, the first photo-generated hole travels towards the a-Si layer and obtains sufficient kinetic energy to generate secondary electron/hole pairs via CEP amplification. Both the magnitude of the instantaneous gain and the detector output current depend on the electric field in the a-Si multiplication region. The magnitude of electric field in a-Si can be modulated by an InGaAs/InP heterojunction using the conduction band (CB) offset at the heterointerface, as illustrated in FIG. 5A-5C.

The CB offset between InGaAs and InP acts as an electron "speed bump" to create a temporary electron accumulation layer at the interface, causing an instantaneous reduction in the E-field in the a-Si layer. Since the CEP gain is highly sensitive to the E-field in a-Si, this results in a sudden decrease in the rate of carrier multiplication, which is manifested by a sudden current drop (i.e., self-quenching). As soon as the detector current is quenched, few electron-hole pairs are generated by the a-Si gain medium. In the meanwhile, those accumulated electrons at the InGaAs/InP interface can cross the 240 meV CB offset via thermionic emission and field-enhancing tunneling. After the temporarily accumulated electrons leave the energy barrier caused by the CB offset, the device returns to the original state and the voltage drop across the a-Si CEP layer is restored. The detector is now self-recovered and able to detect the next photons.

Figure 6A:
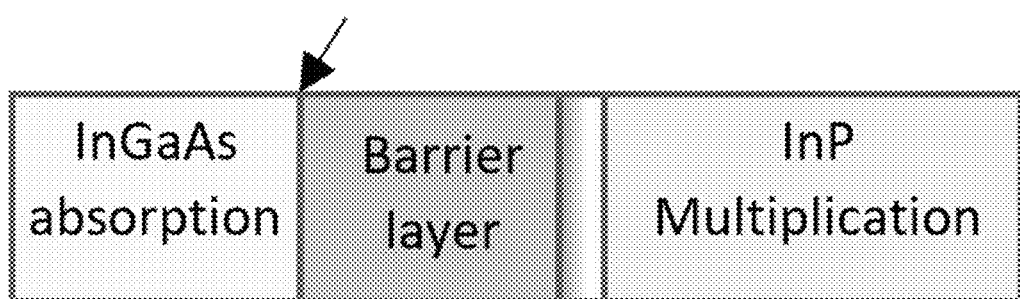
FIG. 6A shows structure of the dependence of self-recovery time and Geiger-mode gain on the barrier height at the heterointerface of an InP/InGaAs SPAD (220K, 5% overbias), according to an exemplary embodiment of the subject disclosure.
Figure 6B:
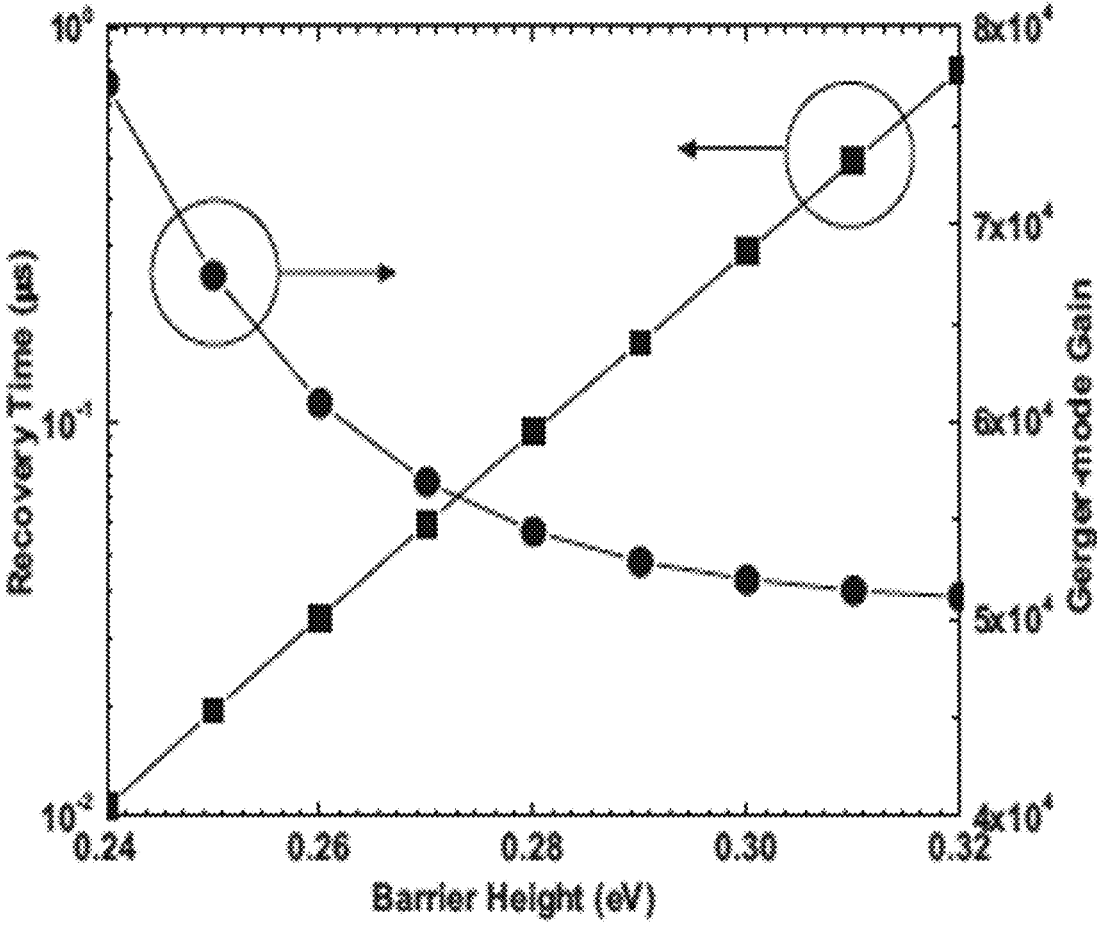
FIG. 6B shows dependence of self-recovery time and Geiger-mode gain on the barrier height at the heterointerface of an InP/InGaAs SPAD (220K, 5% overbias), according to an exemplary embodiment of the subject disclosure.

FIGS. 6A-6B show the dependence of self-recovery time and Geiger-mode gain on the barrier height at the heterointerface of an InP/InGaAs SPAD (220K, 5% overbias). In other words, FIGS. 6A-6B [18] show how the CB offset can be used to control the self-recovery time (self-quenching time is very short, typically <50 ps, so is not discussed here). For an InGaAs/InP SPAD, the CB offset can be adjusted between 240 meV and 320 meV by choosing the heterointerface (e.g., InGaAs/InP, InGaAs/InGaAlAs, InGaAs/InAlAs) to obtain self-recovery time from 1 us to 10 ns. The self-recovery time is changed by 2 orders of magnitude for different applications, the Geiger mode gain is minimally affected, varying from 80,000 to 50,000. The result shows that one can almost decouple the design of the gain medium for the CEP process and the design of the self-quenching and self-recovery properties.

This application incorporates by reference herein in their entirety into this disclosure all of the following cited references, which disclose various findings as discussed in the present disclosure:

1. X. Sun, "Lidar Sensor from Space," Elsevier Inc, 2018.
2. D. Hall et al., "Approaching the Quantum Limit of Photodetection in Solid-State Photodetectors," in *IEEE Trans. Electron Dev.,* 64(12), 2017.

3. A. Goetzberger et al., "Avalanche effects in silicon p-n junctions. II. Structurally perfect junctions," *J. Appl. Phys.,* 34(6), 1963.
4. R. J. McIntyre, "Recent developments in silicon avalanche photodiodes," *Measurement,* 3(4), 1985.
5. A. P. Morrison et al., "Progress towards photon counting between 1 μm and 1.6 μm using silicon with infrared absorbers," *Proc. SPIE* 7681, *Adv. Photon Counting Techn. IV,* 2010.
6. M. D. Eisaman et al., "Single-photon sources and detectors," *Rev. Sci. Instrum.,* 82, 2011.
7. Y. Zhou et al., "Discovery of a photoresponse amplification mechanism in compensated PN junctions," *App. Phys. Lett.,* 106(3), 2015.
8. Y-H. Liu et al., "Cycling excitation process: An ultra efficient and quiet signal amplification mechanism in semiconductor," *Appl. Phys. Lett.,* 107, 2015.
9. L. Yan et al., "An amorphous silicon photodiode with 2 THz gain-bandwidth product based on cycling excitation process," *App. Phys. Lett.,* 111(10), 2017.
10. M A R Miah, I A Niaz, Y H Lo, "Defect Assisted Carrier Multiplication in Amorphous Silicon," *IEEE Journ. of Quant. Electron.,* 56 (3), 2020.
11. I. A. Niaz et al., "Modeling Gain Mechanisms in Amorphous Silicon Due to Efficient Carrier Multiplication and Trap-Induced Junction Modulation," *IEEE Journ. Light. Technol.,* 37(19), 2019.
12. L. Yan et al., "Single photon detector with a mesoscopic cycling excitation design of dual gain sections and a transport barrier," *Opt. Lett.,* 44(7), 2019.
13. K. Zhao et al., "Self-quenching and self-recovering InGaAs/InAlAs single photon avalanche detector," *Appl. Phys. Lett.,* 93(15), 2008.
14. J. Cheng et al., "Self-quenching InGaAs/InP single photon avalanche detector utilizing zinc diffusion rings," *Opt. Exp.,* 19(16), 2011.
15. S. You et al., "Physics of single photon avalanche detectors with built-in self-quenching and self-recovering capabilities," *IEEE Journ. of Quant. Electron.,* 48(7), 2012.
16. K. Zhao et al., "Non-Geiger-mode single-photon avalanche detector with low excess noise," *NASA Tech Briefs,* May 2010.
17. S. N. Rahman et al., "Non-Geiger mode single photon detector with multiple amplification and gain control mechanisms," *Journ. of App. Phys.,* 115(17), 2014.
18. S. You, J. Cheng, and Y-H. Lo, "Physics of single photon avalanche detectors with built-in self-quenching and self-recovering capabilities," IEEE Journal of Quantum Electronics, Vol. 48, No. 7, (July 2012), pp. 960-967.

The foregoing disclosure of the exemplary embodiments of the present subject disclosure has been presented for purposes of illustration and description. It is not intended to be exhaustive or to limit the subject disclosure to the precise forms disclosed. Many variations and modifications of the embodiments described herein will be apparent to one of ordinary skill in the art in light of the above disclosure. For example, the example measurements and values presented in the disclosure are not limiting of the subject matter, but merely show an example that has been used. It would be apparent to one having ordinary skill in the art that some variation and range is possible and expected with each of the variables presented, and which would result in the desired outcome. The scope of the subject disclosure is therefore to be defined only by the claims appended hereto, and by their equivalents.

Further, in describing representative embodiments of the present subject disclosure, the specification may have presented the method and/or process of the present subject disclosure as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present subject disclosure should not be limited to the performance of their steps in the order written, and one skilled in the art can readily appreciate that the sequences may be varied and still remain within the spirit and scope of the present subject disclosure.

What is claimed is:

1. A photodetector, comprising:

a multiplication structure;

a light absorbing layer positioned underneath the multiplication structure;

a self-quenching and self-recovering structure positioned underneath the light absorbing layer; and a substrate positioned underneath the self-quenching and self-recovering structure, wherein the self-quenching and self-recovering structure comprises a heterostructure which includes a layer of InP, a first layer and a second layer of InGaAsP sandwiching the layer of InP.

2. The photodetector in claim 1, wherein the multiplication structure comprises a cycling excitation process (CEP).

3. The photodetector in claim 1, wherein the multiplication structure includes a layer of a-Si.

4. The photodetector in claim 3, wherein the layer of a-Si has thickness of about 30-50 nm.

5. The photodetector in claim 1, wherein the light absorbing layer includes a layer of InGaAsP.

6. The photodetector in claim 5, wherein the light absorbing layer of InGaAsP has an E.sub.g=1.1 um.

7. The photodetector in claim 1, wherein the first layer and the second layer of InGaAsP in the heterostructure have an E.sub.g=1.0 um.

8. The photodetector in claim 1, wherein the InP layer is undoped.

9. The photodetector in claim 1, wherein the InP layer has a thickness of about 50 nm.

10. The photodetector in claim 1, further comprising a layer of ITO positioned above the multiplication structure.

11. A photodetector, comprising:

a multiplication structure made of a disordered material;

a light absorbing layer positioned adjacent to the multiplication structure;

a self-quenching and self-recovering structure positioned adjacent to the light absorbing layer; and a substrate positioned underneath the self-quenching and self-recovering structure.

\* \* \* \* \*